(12) United States Patent
Lopatin

(10) Patent No.: US 6,440,830 B1
(45) Date of Patent: Aug. 27, 2002

(54) METHOD OF COPPER-POLYSILICON GATE FORMATION

(75) Inventor: Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 37 days.

(21) Appl. No.: 09/651,760

(22) Filed: Aug. 30, 2000

(51) Int. Cl.$^7$ .................. H01L 21/3205; H01L 21/4763
(52) U.S. Cl. .................. 438/592; 438/585; 438/586
(58) Field of Search .................. 438/299, 585, 438/586, 687, 592

(56) References Cited

U.S. PATENT DOCUMENTS

| | | | | |
|---|---|---|---|---|
| 6,015,747 A | * | 1/2000 | Lopatin et al. | 438/586 |
| 6,074,921 A | * | 6/2000 | Lin | 438/299 |
| 6,140,231 A | * | 10/2000 | Lin et al. | 438/653 |
| 6,271,106 B1 | * | 8/2001 | Grivna et al. | 438/570 |

OTHER PUBLICATIONS

Wolf et al, Silicon Processing for the VLSI Era, Lattice Press, 1986, vol. 1, p. 187–191.*
Van Zant, Peter, Chapter Thirteen "METALIZATION", Microchip Fabrication—A Practicle Guide to Semiconductor Processing, McGraw–Hill 1979, pp 389–418.

* cited by examiner

*Primary Examiner*—Matthew Smith
*Assistant Examiner*—Craig P. Lytle
(74) *Attorney, Agent, or Firm*—Eschweiler & Associates, LLC

(57) ABSTRACT

In one embodiment, a method for manufacturing a field effect transistor (100) includes forming a polysilicon gate (104) on a surface (106) of a semiconductor substrate (102) in association with adjacent source/drain regions (110, 112) and forming dielectric spacers (124, 126) on sides of the polysilicon gate. The method further includes forming a trench (202) between the dielectric spacers on a surface (200) of the polysilicon gate and filling at least a portion of the trench with barrier and copper or other high conductivity metal to form a copper-polysilicon gate of the field effect transistor.

14 Claims, 9 Drawing Sheets

METHOD OF COPPER-POLYSILICON GATE FORMATION

RELATED APPLICATIONS

This application is related to application Ser. No. 09/651513 entitled "Method of Copper-Polysilicon T-Gate Formation," commonly assigned with this application and filed on even date herewith.

BACKGROUND OF THE INVENTION

The present invention relates generally to semiconductor devices and the manufacture thereof. More particularly, the present invention relates to a method of forming metal-oxide-semiconductor field effect transistors (MOSFETs) having copper metallization on a polysilicon gate.

The need has been recognized for improved metallization systems in next generation semiconductor devices. Reduced line widths and film thicknesses have resulted in excessive resistivity in current metallization systems. Copper, has a very low resistivity and is under development for second and third level metal layers on integrated circuits. However, heretofore, copper has been avoided for first level metallization. Copper has a high diffusivity in silicon which complicates formation ohmic contacts between copper and silicon or polysilicon. Accordingly, materials such as suicides have instead been used for contact formation and the use of copper interconnect has been limited to upper level metal layers.

U.S. Pat. No. 6,015,747 discloses an advanced metallization system in which electroless metal is selectively deposited on the gate and on the source and drain regions. U.S. Pat. No. 6,015,747 is incorporated herein by reference. This provides distinct advantages for reducing bridging of the gate metal and the source/drain metal. However, the techniques described therein are not adapted to metallization with highly conductive metals such as copper. Accordingly, there is a need for an improved method for manufacturing semiconductor devices with highly conductive metal at the first level or interconnect metal.

SUMMARY

By way of introduction only, the present embodiments provide improved metallization in a semiconductor device such as a complementary metal-oxide-semiconductor (CMOS) integrated circuit. The method involves forming spacers on opposing sides of a polysilicon gate formed on the surface of the semiconductor. A trench is then formed between the spacers by selectively etching the polysilicon. Highly conductive metal such as copper is then deposited in the trench to form a copper-polysilicon gate. In an additional embodiment, electroless metal is deposited to form electrical contacts with the copper-polysilicon gate and the source/drain regions of the transistor. In a further embodiment, an electroless barrier metal layer is formed on the copper-polysilicon gate and a blanket of nickel or other similar metal is deposited on the surface of the semiconductor. The nickel is annealed to form nickel silicide on the exposed source/drain regions of the MOSFET. In a still further embodiment, nickel or similar metal is blanket deposited on the substrate including the copper-polysilicon gate. A copper-nickel alloy is formed on the copper-polysilicon gate and nickel-silicide is formed at the source/drain regions.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
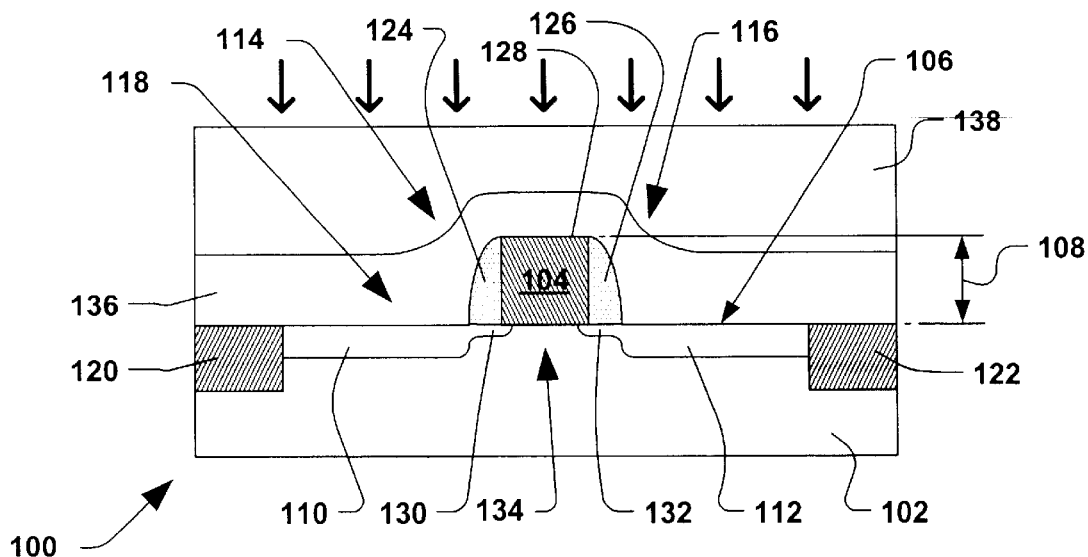
FIG. 1 through FIG. 24 are cross sectional views showing steps in the manufacture of a field effect transistor.

Referring now to FIG. 1, it shows a cross-sectional view of a field effect transistor 100 illustrating one step in the manufacture of the field effect transistor 100. The field effect transistor 100 is formed on a semiconductor substrate 102. The semiconductor substrate 102 may be a portion of a semiconductor wafer, for example made of silicon or another semiconductor material, or the semiconductor substrate 102 may be a portion of an integrated circuit which includes the field effect transistor 100.

As illustrated in FIG. 1, the field effect transistor 100 includes a polysilicon gate 104 formed on a surface 106 of the semiconductor substrate 102. The polysilicon gate 104 has a predetermined thickness 108. The predetermined thickness 108 corresponds to the height of the polysilicon gate 104 above the surface 106 of the semiconductor surface 102. In one embodiment, the polysilicon gate 104 is formed from polysilicon deposited as a single layer upon a thin gate oxide grown on the surface 106 of the semiconductor substrate 102. The polysilicon gate is patterned using conventional semiconductor photolithography techniques to define the shape of the polysilicon gate 104. In alternative embodiments, other materials such as silicon nitride or metal may form part of the polysilicon gate, which may be more generally called a gate stack. For convenience, the gate stack which operates as a gate for the field effect transistor 100 will be referred to herein as a polysilicon gate.

The polysilicon gate 104 is formed on the surface 106 of the semiconductor substrate 102 in association with adjacent source/drain regions. Source and drain regions are defined on either side of the polysilicon gate 104. A source region 110 is formed in the semiconductor substrate 102 on a first side 114 of the polysilicon gate 104. A drain region 112 is formed on the semiconductor substrate 102 on a second side 116 of the polysilicon gate 104. Designation of the source region 110 and drain region 112 as the source and drain of the field effect transistor 100 is arbitrary. They are collectively referred to herein as source/drain regions. The source region 110 and the drain region 112 are interchangeable in the operation of the field effect transistor 100.

In conventional semiconductor device processing, the source region 110 and the drain region 112 are defined in a diffusion area surrounded by field oxide on the surface of the semiconductor substrate 102. A layer of field oxide is grown on the surface of a wafer and patterned using conventional manufacturing techniques. Active areas, such as active area 118 are formed in between oxide islands, such as field oxide 120 and field oxide 122. Field oxide islands isolate active areas from each other.

Dielectric spacers are formed on opposing sides of the polysilicon gate 104. A first spacer 124 is formed immediately adjacent the first side 114 of the polysilicon gate 104. A second spacer 126 is formed immediately adjacent the second side 116 of the polysilicon gate 104. The first spacer 124 and the second spacer 126 extend from the surface 106 of the semiconductor substrate 102 to substantially a top surface 128 of the polysilicon gate 104. The spacers are formed using conventional techniques, by depositing a layer of silicon dioxide or other suitable material on the surface of the semiconductor substrate 102, etching away all but the silicon spacers, including first spacer 124 and second spacer 126.

The first spacer 124 and the second spacer 126 are used for forming lightly doped drain regions, including a source extension 130 and a drain extension 132. The source extension 130 and the drain extension 132 are relatively lightly doped and are used to reduce short channel effects in the field effect transistor 100. The source region 110, the source extension 130, the drain region 112 and the drain extension 132 are all doped to a doping type opposite the doping of the channel region 134 under the polysilicon gate 104.

At the manufacturing step illustrated in FIG. 1, a masking layer 136 has been deposited on the surface 106 of the semiconductor substrate 102. The masking layer 136 can be any suitable material, such as photoresist, low-k dielectric, silicon dioxide, silicon nitride, or otherwise. The symbol k refers to the dielectric constant of the masking layer 136. A typical low value for a low k dielectric as used herein is 1.7 to 3.3. A layer of photoresist 138 is formed on top of the masking layer 136.

Lastly, in the manufacturing step illustrated in FIG. 1, a reactive ion etching (RIE) operation is performed, as indicated by the arrows in FIG. 1. Reactive ion etching allows closely controlled selective removal of layers and portions of layers during semiconductor processing. The masking layer 136 has been deposited to a depth substantially equal to the predetermined thickness 108 of the polysilicon gate 104. Thus, a top portion of the masking layer 136 can be removed by reactive ion etching to expose the top surface 128 of the polysilicon gate 104. The remainder of the semiconductor substrate 102, including the source region 110 and the drain region 112 and dielectric surfaces such as the surfaces of oxide island 120 and oxide island 122, remain protected by the masking layer 136. Other suitable methods may be used to expose the top surface of the polysilicon gate while protecting the remainder of the semiconductor substrate 102.

Figure 2:
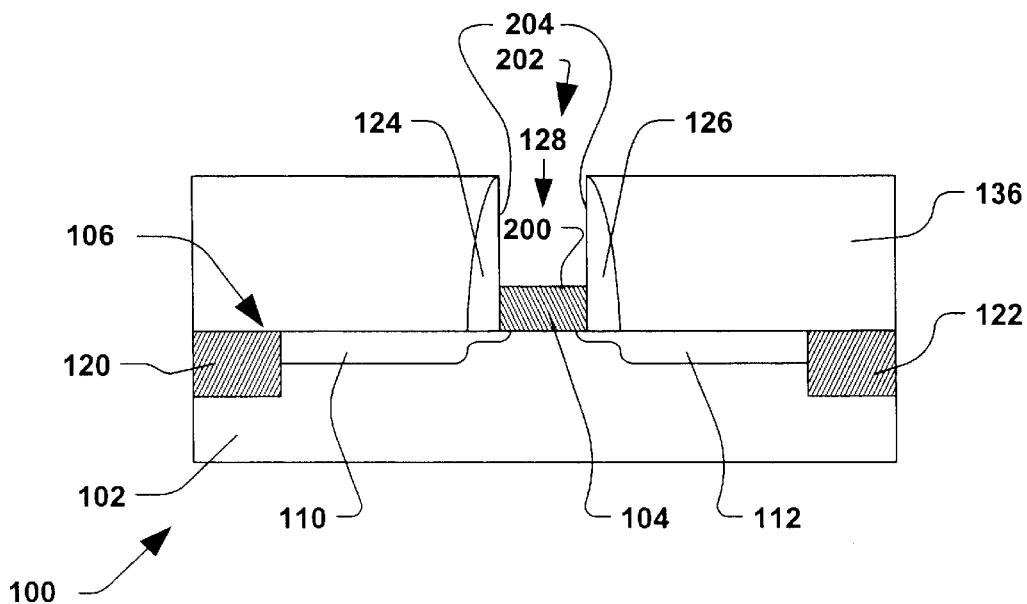

FIG. 2 is a cross-sectional view of the field effect transistor 100 at a subsequent step in the manufacturing process. In FIG. 2, a gate structure in the form of polysilicon gate 104 has been formed on the surface 106 of the semiconductor substrate 102. Further, first and second spacers 124, 126 have been formed on opposing sides of the gate structure. As illustrated in FIG. 2, a top portion or surface 200 of the gate structure has been etched, along with the first and second spacers 124, 126, to define a trench 202. The trench 202 is defined by inner walls 204 of the spacers 124, 126. The trench 202 is etched to an etch depth, which may be any suitable depth. For example, the trench 202 is etched to a depth of approximately one-half the original thickness of the polysilicon gate 104.

The trench is formed between the dielectric spacers 124, 126 on the top surface 128 of the polysilicon gate 104. As shown in FIG. 2, the surface of the semiconductor substrate 102 is deposited with a low k dielectric material 136 which defines an opening for the trench 202. The low k dielectric material 136 may be any suitable material, including poly (arylene ether) (PAE), fluorinated aromatic ether (FLARE), fluorinated polyimide (FPI), benzocyclobutene (BCB), and polyimide (PI) or any other suitable organic dielectric. The dielectric material preferably has a dielectric constant in the range 1.7 to 3.3. A photoresist is deposited on the dielectric material 136. The top surface of the substrate 102 is etched in a RIE process to expose the top surface 128 of the polysilicon gate 104, as well as the top extent of the dielectric spacers 124, 126. Subsequently, the polysilicon gate 104 is etched using an RIE process to form the trench 202.

Figure 3:
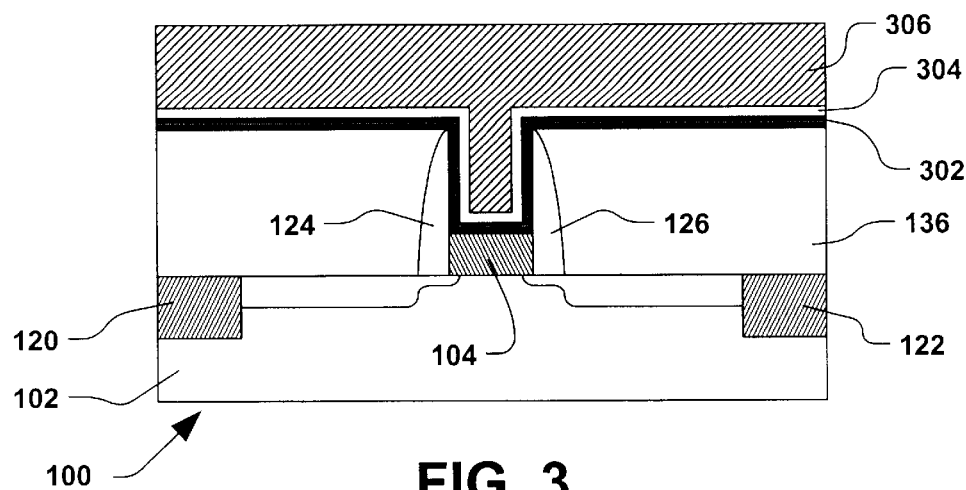

FIG. 3 is a cross section of the field effect transistor 100 at a subsequent step in the manufacturing process. In FIG. 3, at least a portion of the trench 202 has been filled with a high conductivity metal, preferably by a damascene process. Preferably, the high conductivity metal comprises copper or an alloy of copper. In such an embodiment, the trench 202 is filled with copper to form a copper-polysilicon gate. However, in alternative embodiments, the high conductivity metal could comprise silver, gold, alloys of these metals or any other similar high conductivity metal.

A damascene process generally involves etching a trench or contact hole and filling the hole with a metal such as copper. In FIG. 3, the damascene process first includes depositing a barrier material 302 on an exposed portion of the gate structure 104 and the first and second spacers 124, 126. Subsequently, the high conductivity metal 306 is deposited in the trench 202 on the barrier material 302.

In one embodiment, the barrier material 302 is a layer of tantalum deposited by physical vapor deposition (PVD) or chemical vapor deposition (CVD). Other materials may be used as well, including tantalum nitride, tungsten nitride, titanium nitride, titanium silicone nitride, or tantalum silicon nitride. In one embodiment, the barrier material 302 is 100 to 300 angstroms thick, but other thicknesses may be used. The barrier material 302 forms a diffusion barrier to isolate the copper or other high conductivity metal from the polysilicon gate 104. Accordingly, the thickness and composition of the barrier material should be chosen to ensure a barrier against diffusion under manufacturing and operating conditions, including exposure to chemical processes, temperatures and electric fields.

The high conductivity metal deposition is preferably started by depositing a seed layer 304 on the barrier layer 302. For example, a 300 to 700 angstrom thick layer of copper seed layer may be deposited by PVD, CVD or electroless deposition on the surface of the barrier material 302. Subsequently, the layer of high conductivity metal, such as copper, may be deposited by electroplating to fill at least a portion of the trench 202. Typically, the entire surface of the semiconductor substrate 102 is electroplated with copper. The layer 306 of high conductivity metal is preferably relatively thick, such as 0.3 to 0.5 $\mu$m. After electroplating, an anneal step is preferably applied at a temperature of 200° to 400° C. to form reliable electrical contact between the high conductivity metal 306, the barrier material 302 and the polysilicon gate 104.

Figure 4:
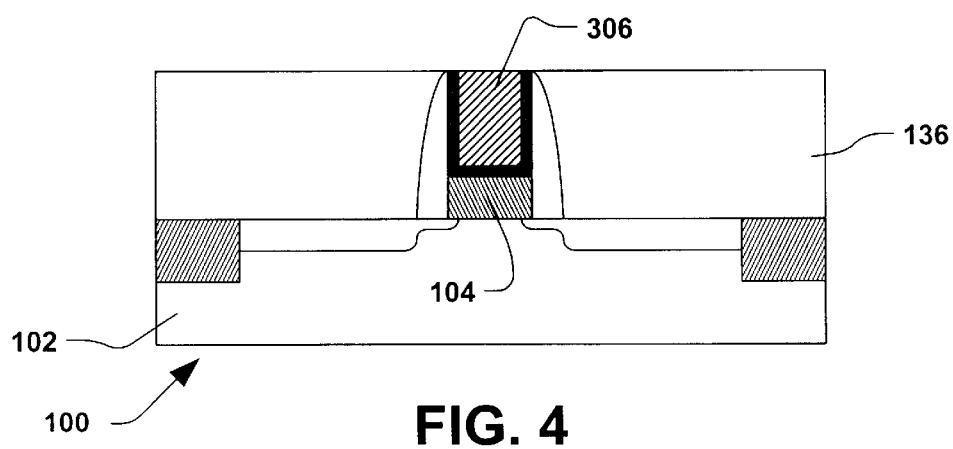

At FIG. 4, a thinning process is applied to remove the metalization from the surface of the substrate 102. In one embodiment, a chemical mechanical polishing process is applied to remove the copper or other metal 306 and the barrier layer 302 from the top surface of the substrate 102. Alternatively, an etch process can be used to remove the metalization from the substrate 102. The thinning process also operates to planarize the semiconductor substrate.

Figure 5:
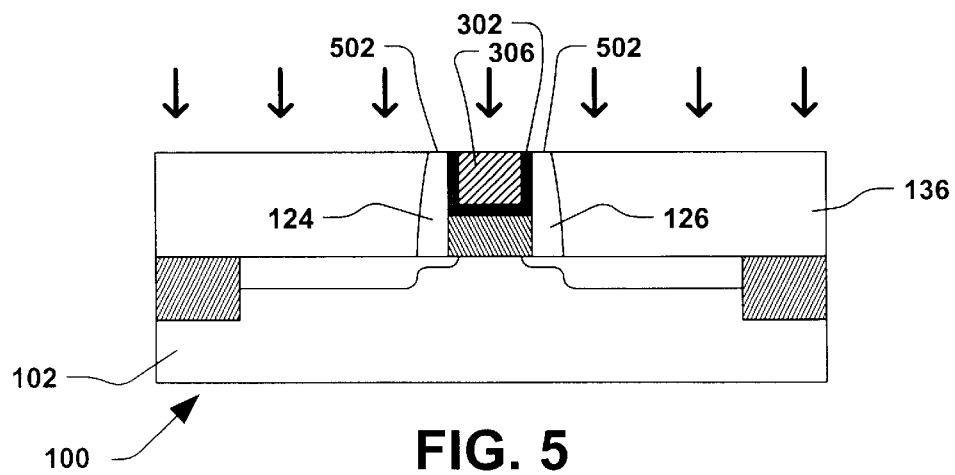
Figure 6:
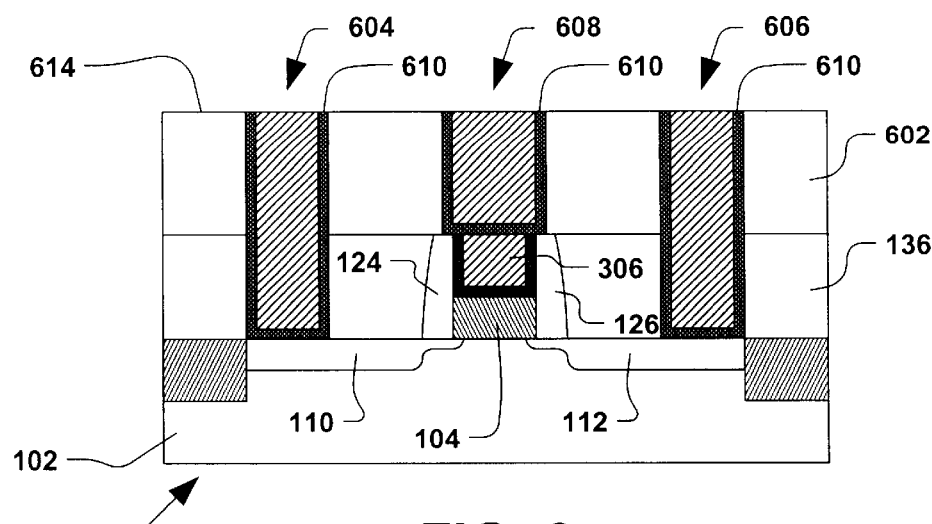

FIG. 5 and FIG. 6 illustrate a first embodiment of a method for manufacturing a semiconductor device. In FIG. 5, after removal of the metalization from the substrate 102, a thinning process is applied to reduce the thickness of the materials on the substrate 102. In particular, the masking layer 136, the first and second spacers 124, 126 and the materials in the trench 202, including the barrier layer 302 and the high conductivity metal 306 are removed in part by a process such as chemical mechanical polishing, as indicated by the arrows in FIG. 5. Alternatively, an etch process may be used. The thinning process removes a portion of the spacers 124, 126 to expose a wider top surface 502 of the spacers 124, 126.

In FIG. 6, during a subsequent step in the manufacturing process, a low k dielectric material 602 is deposited on the top surface of the semiconductor substrate 102. The dielectric material 602 may be any suitable dielectric, such as those described above in connection with shown FIG. 2,. After a deposition of the dielectric material 602, a standard photolithography and etch step are provided to define contact openings 604, 606, 608. Contact opening 604 permits electrical contact to the source 110 of the field effect transistor 100; contact opening 606 permits electrical contact to the drain 112 of the transistor 100; and contact opening 608 permits electrical contact to the polysilicon gate 104 of the transistor 100. During the etch process, etching will proceed until the dielectric materials 136, 602 are etched away in the contact openings 604, 606, 608. Etching will automatically stop on the source and drain regions 110, 112 and on the wide top surface 502 of the spacers 124, 126.

After etching the contact openings 604, 606, 608, the contact openings are filled with high conductivity metal such as copper using a damascene process. Initially a barrier material 610 such as tantalum, tantalum nitride or any of the other materials described above is deposited on the surface of the substrate 102 using a suitable technique, such as chemical vapor deposition. The CVD barrier material 610 lines the inside of the contact holes 604, 606, 608. In addition, in the source and drain contact openings 604, 606, the barrier material 610 is deposited on the exposed silicon of the source 110 and drain 112 at the surface 106 of the semiconductor substrate 102. In the contact opening 608, the barrier material 610 lines the inner walls of the contact opening and the top surface of the high conductivity metal 306 formerly deposited on the polysilicon gate 104. Subsequently, a seed layer of high conductivity metal such as copper may be deposited on the surface of the barrier material 610. Then the contact openings 604, 606, 608 are filled with a high conductivity metal, for example, by electroplating copper in the contact openings. By a process such as chemical mechanical polishing, the copper and barrier material deposited on the top surface 614 of the semiconductor substrate 102 during the damascene process is removed. The resulting cross section appears in FIG. 6.

Thus, by the process illustrated in FIGS. 2 through 6, electrical contact is made to the polysilicon gate 104 and to the source 110 and the drain 112 of the field effect transistor 100. Preferably, the same damascene process used to contact the source 110, drain 112 and high conductivity metal layer 306 is also used to form the first layer metal interconnects in the integrated circuit 100. In this manner, copper interconnect metal can be used for the first layer interconnect in an integrated circuit without the limitations imposed by the high copper diffusivity in silicon.

Figure 7:
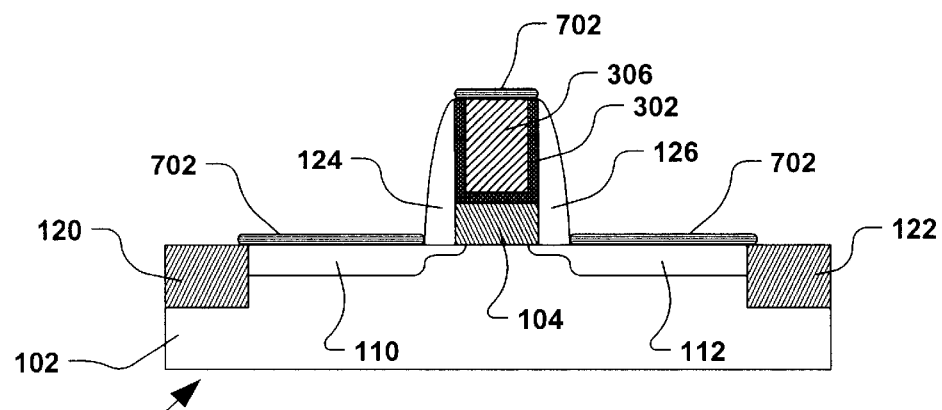

FIG. 7 illustrates an alternative method for forming electrical contacts between first level metal, such as copper, and the source, drain and gate terminals of the field effect transistor 100. The acts illustrated in FIG. 7 follow the acts illustrated in FIG. 4, after removal of the dielectric material 136. Subsequently, electroless metal is deposited on the surface of the semiconductor substrate 102 using techniques described in U.S. Pat. No. 6,015,747 or any other suitable electroless metal deposition techniques. Suitable electroless metals include nickel phosphide, cobalt phosphide, nickel phosphorous tungsten, and cobalt phosphorous tungsten. The thickness of the electroless metal layer 702 is preferably in the range 100 Å to 1,000 Å. In some embodiments, it may be preferable to add an activation act prior to electroless metal deposition. An activation act activates the silicon surface in the source and drain regions 110, 112. An activation step includes, for example, immersing the semiconductor substrate 102 in a solution with palladium. This allows the electroless metal 702 to nucleate on the silicon surface. Subsequent to the steps shown in FIG. 7, copper metalization may be applied to define first level interconnect using the techniques shown and described in connection with FIG. 6.

Figure 8:
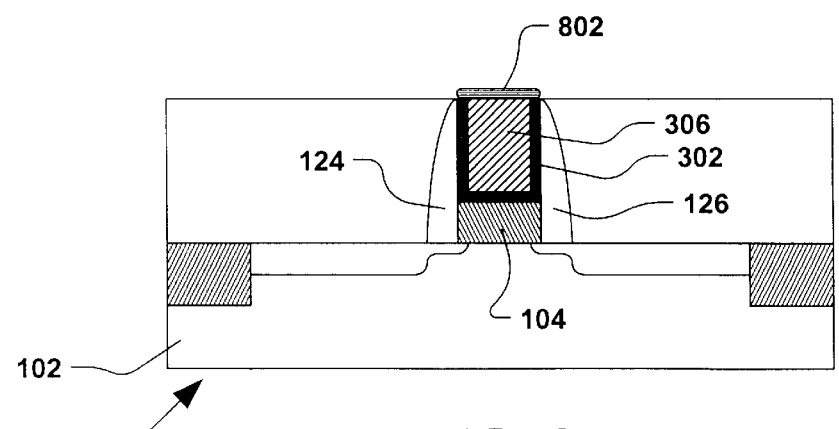
Figure 9:
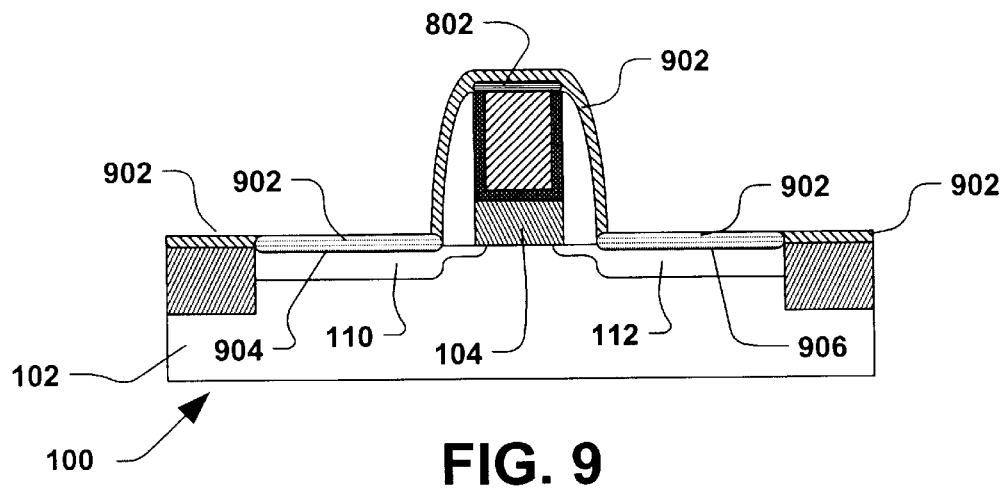
Figure 10:
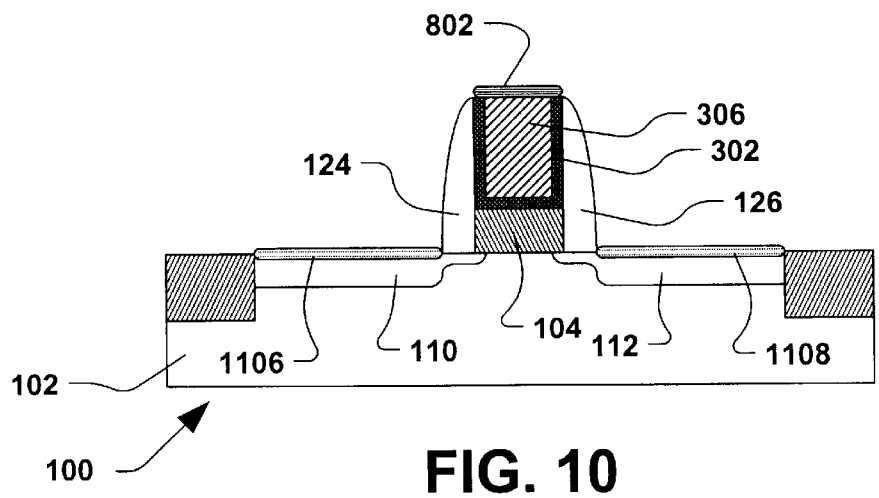

FIGS. 8 through 10 illustrate an alternative technique for applying copper metallization as a first layer interconnect in an integrated circuit. In FIG. 8, an electroless barrier layer is formed on the top surface of the polysilicon-copper gate 306. The acts illustrated in FIG. 8 occur after the act illustrated in FIG. 4 above. The deposited electroless metal may be cobalt phosphorous tungsten, nickel phosphorous tungsten or any other suitable metal or alloy. The electroless barrier layer 802 is deposited by selective electroless deposition, as described in the aforementioned U.S. Pat. No. 6,015,747. Subsequently, the masking layer, dielectric 136, is removed by etching or other suitable process. Thereafter, a conformal nickel film 902 is deposited on the surface of the semiconductor substrate 102. Preferably, the thickness of the nickel film 902 is on the order of 100 to 300 Å. Subsequently, an anneal step is applied in which the semiconductor substrate 102 is heated to a temperature suitable to form nickel silicide regions 904, 906 on the silicon surface of the source and drain regions 110, 112, respectively (FIG. 9). The nickel silicide only forms on the source and drain regions 110, 112. On the polysilicon gate 104, the electroless barrier material 802 prevents reaction between copper and nickel.

Subsequently, the nickel film 902 is removed from the surface of the semiconductor substrate 102, as shown in FIG. 10. FIG. 10 also shows the completed gate structure, ready for electrical contacting by first layer interconnect metal. Above the channel region of the transistor 100, between the source 110 and the drain 112, the polysilicon gate 104 is formed on a gate oxide layer. A barrier layer 302 is next, formed on top of the polysilicon gate 104. The bulk of the trench between the spacers 124, 126 is filled with copper 306. Lastly, the electroless metal barrier 802 is formed on top of the copper 306, preventing interdiffusion of nickel and copper during the nickel silicide process for the source drain regions 110, 112.

Following the acts illustrated in FIG. 10, the transistor 100 is ready for deposition of copper or other high conductivity metal using a damascene or other process, as shown in FIG. 6, to form first layer interconnect metal of the integrated circuit including the transistor 100. Processing continues as described in conjunction with FIG. 6.

Figure 11:
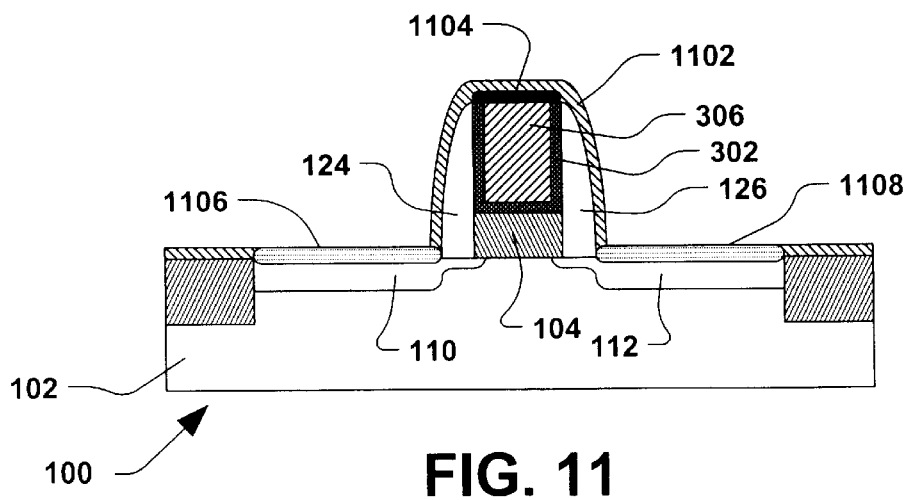
Figure 12:
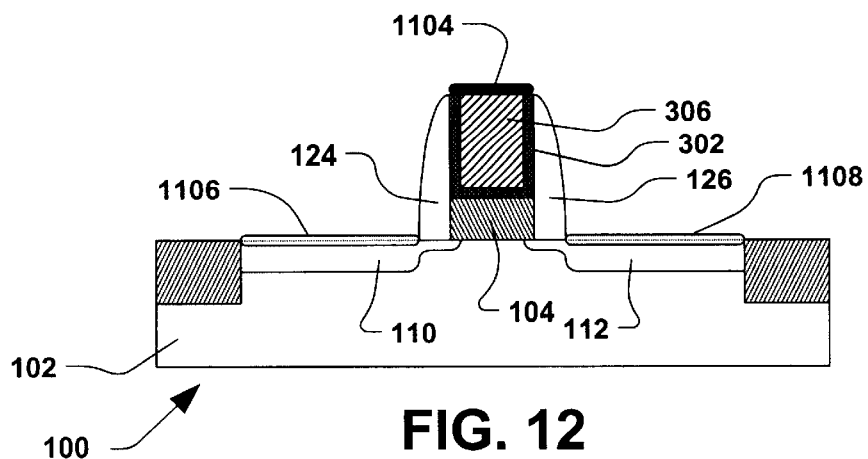

FIGS. 11 and 12 illustrate yet another technique for preparing the field effect transistor 100 for contacting by a copper first layer interconnect. The process shown in FIG. 11 occurs after the acts shown in FIG. 4, following removal of the dielectric layer 136. Subsequently, a blanket film of nickel 1102 is deposited on the surface of the semiconductor substrate 102. Unlike the process shown beginning at FIG. 8, no barrier metal is first deposited. Rather, the nickel 1102 is deposited on the surface of the copper 306. After a blanket film deposition of the nickel, an anneal process is performed, forming a copper nickel alloy 1104 on the top surface of the copper 306. At the same time, nickel silicide regions 1106, 1108 are formed in the source and drain regions 110, 112, respectively of the field effect transistor 100. After alloying, the nickel film 1102 is removed from the dielectric and other surfaces of the semiconductor substrate 102. The nickel alloy 1104 remains on the top surface of the copper-polysilicon gate. Subsequently, by a damascene or other suitable process, such as is shown in FIG. 6, copper may be applied as the first level interconnect in an integrated circuit including the field effect transistor 100.

FIG. 12 shows the layers forming the gate region of the field effect transistor 100 following removal of the nickel layer 1102. Above the channel region between the source 110 and the drain 112, the polysilicon gate 104 is formed on a field oxide layer. A barrier material 302 separates the polysilicon gate 104 and the spacers 124, 126 from the copper 306 filling the trench. Formed on top of the copper 306 is the copper nickel alloy 1104.

In the processes illustrated in FIGS. 8 through 12, cobalt could be substituted for nickel. Other suitable substitutions may be made, including substituting any appropriate high conductivity metal for copper.

FIGS. 13–24 illustrate various embodiments of a method for copper-polysilicon T-gate formation. A T-gate has the appearance of the letter T when viewed in cross section. A T-gate is suitable for forming vary narrow transistor gates, corresponding to a short electrical gate length for the transistor. Because of limitations of photolithographic techniques and device manufacturing capabilities, T-gates allow the shortest electrical gate length while permitting reliable electrical contact to the gate. The lower portion of the T has a width equal to the minimum drawn line width for the manufacturing process. The upper portion of the T has a wider width which is equal to the minimum metallization width for the manufacturing process. A T-gate has relatively high resistance because of its narrow width. However, combining metallization with a polysilicon T-gate reduces the resistance of the T-gate.

Figure 13:
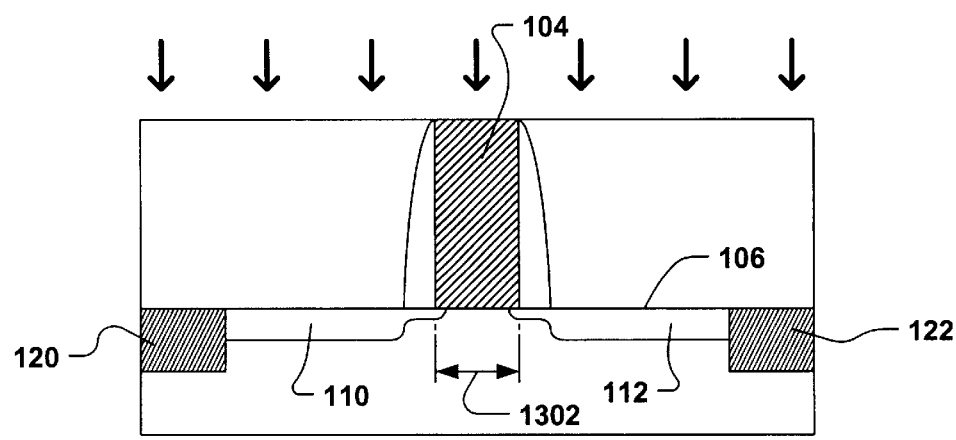

FIG. 13 illustrates initial acts in the T-gate formation process. FIG. 13 generally corresponds to FIG. 1. In FIG. 13, a polysilicon gate 104 has been defined on the surface 106 of a semiconductor substrate 102. A source 110 and a drain 112 have been diffused or implanted into the silicon substrate 102. Spacers 124, 126 have been defined on opposing sides of the polysilicon gate 104. A dielectric layer 136 has been deposited on the surface 106 of the semiconductor substrate 102 and patterned using conventional photolithographic techniques. The dielectric material 136 may be any suitable material such as PAE, FLARE, FPI, BCB, or PI. Preferably, the dielectric material is organic in nature and has a relatively low dielectric constant such as a dielectric constant in the range 1.7 to 3.3.

Figure 14:
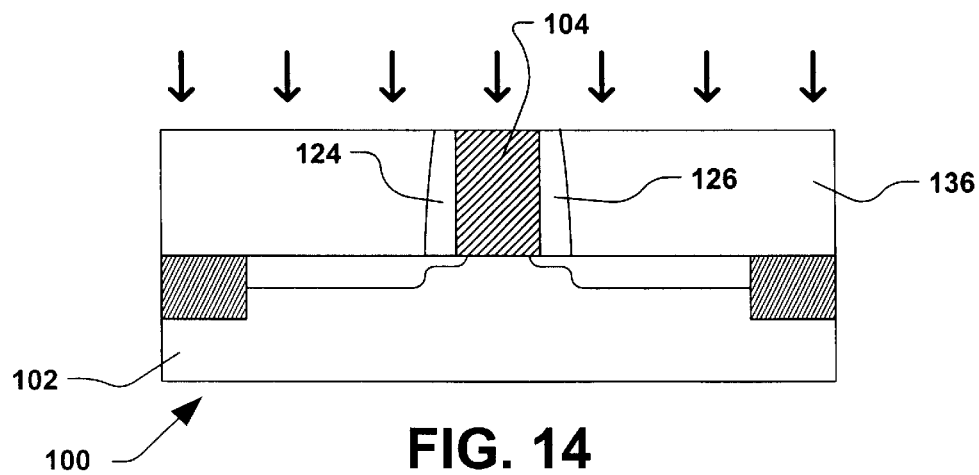

In FIG. 14, a portion of the polysilicon gate 104 and the spacers 124, 126 has been removed by reactive ion etching (RIE) or by chemical mechanical polishing (CMP). This is indicated by the arrows in FIG. 13. This process of removing a portion of the material reduces the overall thickness of the dielectric material 136 and the polysilicon gate 104 and the spacers 124, 126. This etching or polishing process exposes wider portions of the spacers 124, 126.

Figure 15:
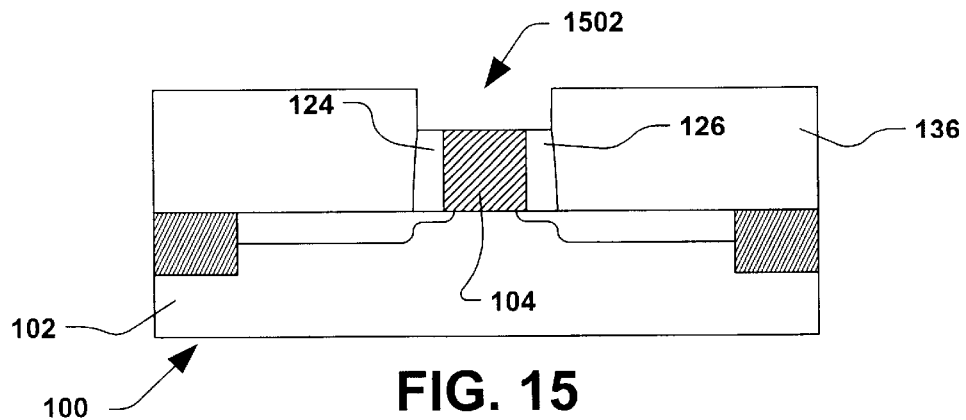

Subsequently, as is illustrated in FIG. 15, a reactive ion etch process is performed. This process etches a top portion or surface 1504 of the polysilicon gate structure 104 and the first and second spacers 124, 126 to define a trench 1502. The reactive ion etching process etches only the polysilicon of the polysilicon gate 104 and the silicon dioxide or silicon nitride or other material which forms the spacers 124, 126. The etching process does not affect the dielectric material 136.

Figure 16:
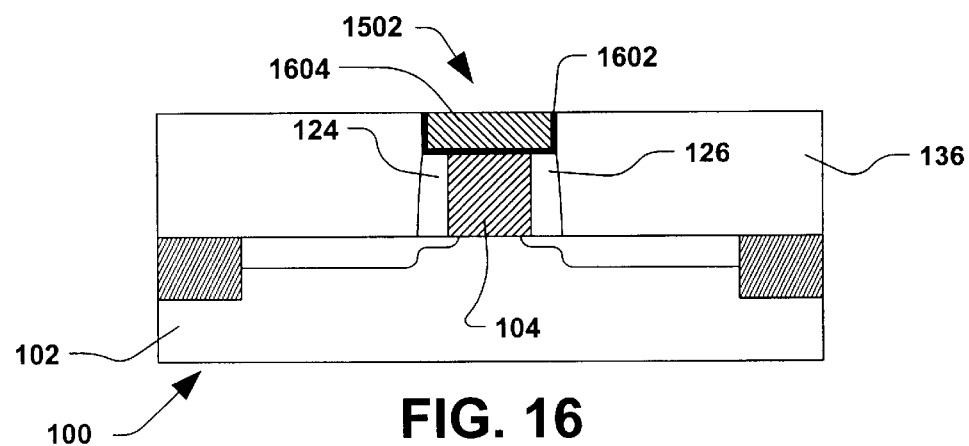

At FIG. 16, a damascene process is used for filling at least a portion of the trench 1502 with a high conductivity metal such as copper. In the damascene process, initially a barrier layer 1602 is deposited by a suitable process such as chemical vapor deposition (CVD). A seed layer of metal such as copper may be deposited on top of the barrier metal. The barrier metal may be any suitable material, such as tantalum, tantalum nitride, tantalum silicon nitride, titanium nitride, titanium silicon nitride, or tungsten nitride. After the barrier material is deposited, a high conductivity metal 1604 such as copper is deposited in the trench on the barrier material 1602. Deposition of the copper or other metal may be by electroplating or by any other suitable technique. Subsequently, the copper and barrier material deposited on the top of the wafer, outside the trench 1502 is removed, for example by chemical mechanical polishing or by etching. The resulting structure appears as is shown in FIG. 16. As can be seen, the gate structure includes a lower portion including the polysilicon gate 104 and an upper portion including the copper or other metal 1604. The gate has a T shape, producing a T-gate.

Figure 17:
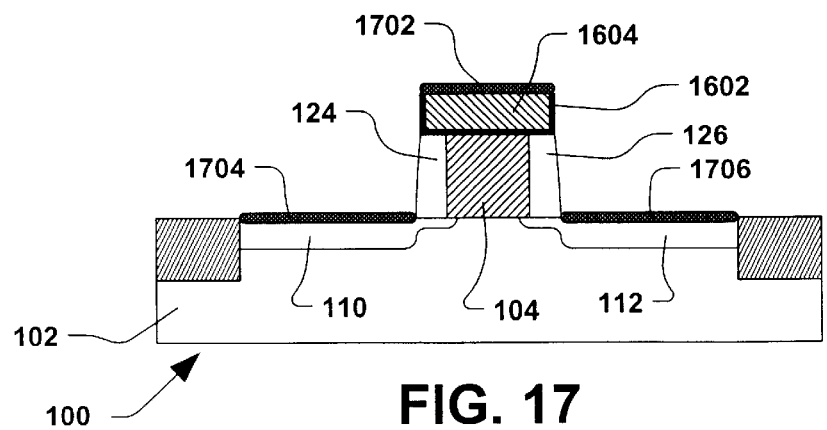

FIG. 17 illustrates a further act in the manufacturing process for the field effect transistor 100. After the damascene process to fill the trench 1502, the mask formed by the dielectric layer 136 is removed. Then, a blanket film deposition of nickel or other suitable metal such as cobalt is performed. The nickel or other metal is deposited across the entire surface of the semiconductor substrate 102, including the top portion of the copper gate 1604 and on the source and drain regions 110, 112, respectively. Next, an anneal step is performed. The anneal process should be sufficient in time and duration to form a nickel silicide region 1704 on the source 110 and a nickel silicide region 1706 on the drain region 112. The anneal should also be sufficient to form a copper nickel alloy 1702 on the top surface of the copper gate 1604. Subsequently, the nickel or other metal is removed by etching or other suitable process from the remaining surfaces of the semiconductor substrate 102.

After the acts shown in FIG. 17, the semiconductor substrate 102 is ready for metallization. In one embodiment, metallization is accomplished using the metalization process illustrated above in connection with FIG. 6.

The copper-polysilicon T-gate defined by this process provides narrower polysilicon gates made without the additional complications of silicidation of the gate. The metallic contact defined by the upper portion of the T can be formed to contact very narrow gates defined by the lower portion of the T. Narrow gates can have an electrical gate length on the order of 50 nm. Also, the combination of the copper and polysilicon gate has higher conductivity than polysilicon gates alone, thereby increasing the speed of CMOS transistors.

Figure 18:
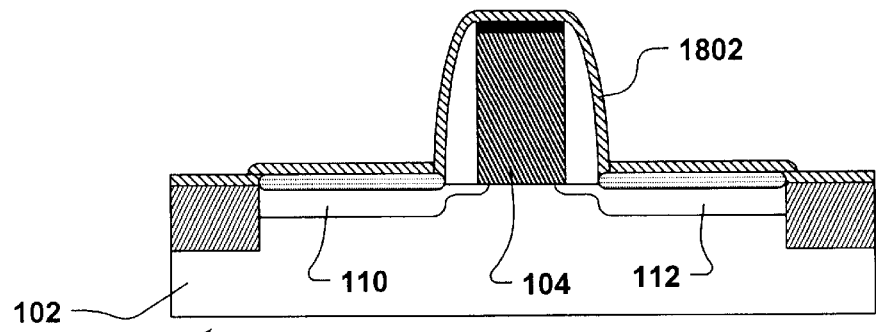

FIGS. 18 through 24 illustrate an alternative technique for formation of a copper-polysilicon T-gate in a field effect transistor. FIG. 18 follows after standard nickel silicide formations on drain, source and gate regions. Further in FIG. 18, a layer of barrier material is deposited on the surface of the semiconductor substrate 102. In the illustrated embodiment, the barrier layer comprises silicon nitride. In alternative embodiments, other dielectric material may be used to form a barrier against copper diffusion into the silicon of the source, drain and gate regions.

Figure 19:
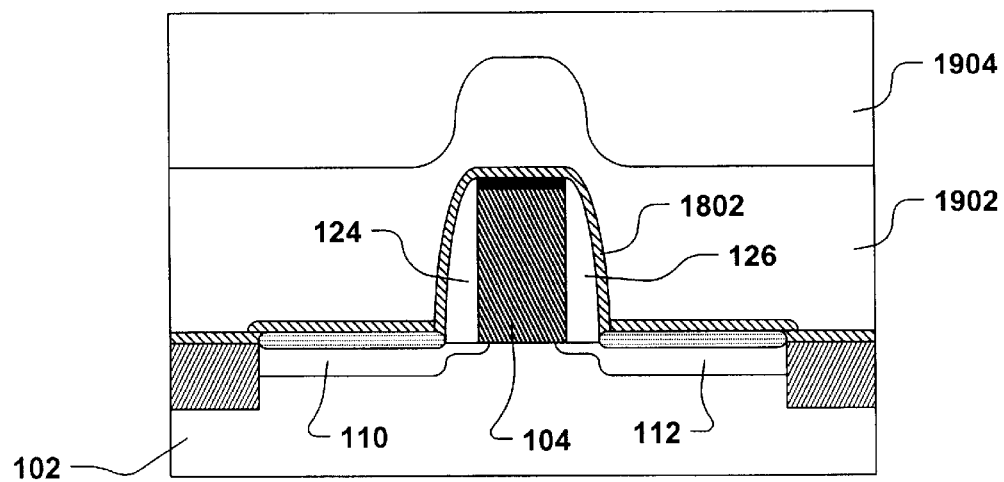
Figure 20:
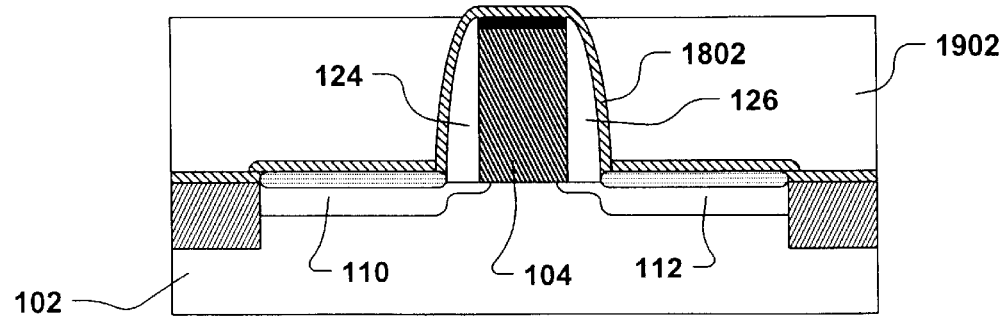

Next, as shown in FIG. 19, two masking layers are formed on the surface of the semiconductor substrate 102. The first mask layer 1902 is followed by deposition of a second mask layer 1904. Alternatively both mask layers may be combined into a single masking layer. Preferably the first masking layer 1902 is formed from a low dielectric constant material, such as PAE, FLARE, FPI, BCB, or PI. The first masking layer is deposited to a depth approximately equal to the height of the polysilicon gate structure above the surface of the semiconductor substrate 102. The second masking layer 1904 is deposited to planarize the top surface of the semiconductor substrate. Subsequently, a reactive ion etch or similar process is applied to further planarize the top surface of the semiconductor substrate 102, producing the structure illustrated in FIG. 20. Also, as shown in FIG. 20, a chemical mechanical polishing process is applied to the top surface of the semiconductor substrate 102 to thin all materials. The surface of the substrate 102 is polished to expose the wide portions of the spacers 124, 126.

Figure 21:
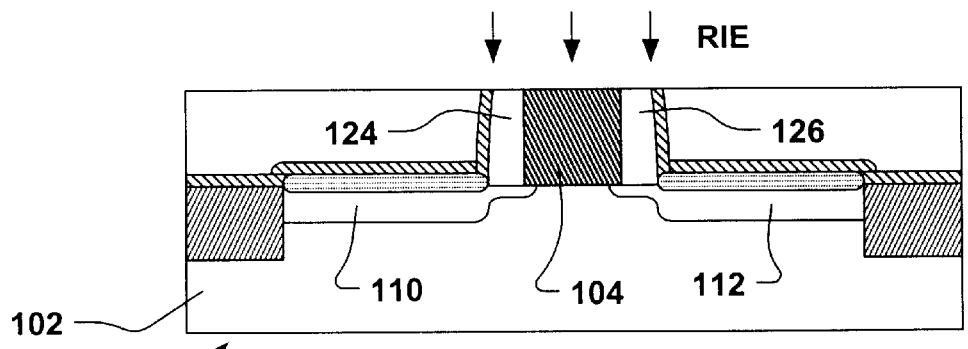
Figure 22:
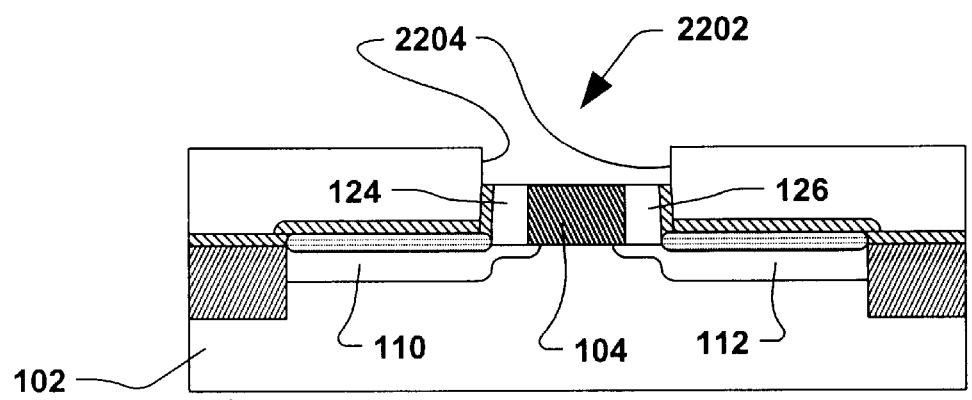

With the spacers 124, 126 and the polysilicon gate 104 exposed as shown in FIG. 21, a reactive ion etch process is introduced to etch a trench 2206 as shown in FIG. 22. The trench 2202 is defined by the top surfaces of the polysilicon gate 104 and the spacers 124, 126, as well as by the inner sidewalls 2204 of the masking layer 1902.

Figure 23:
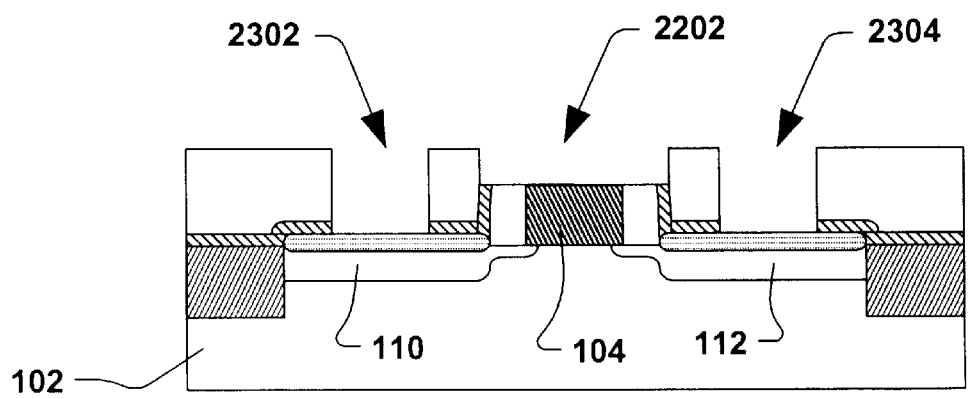
Figure 24:
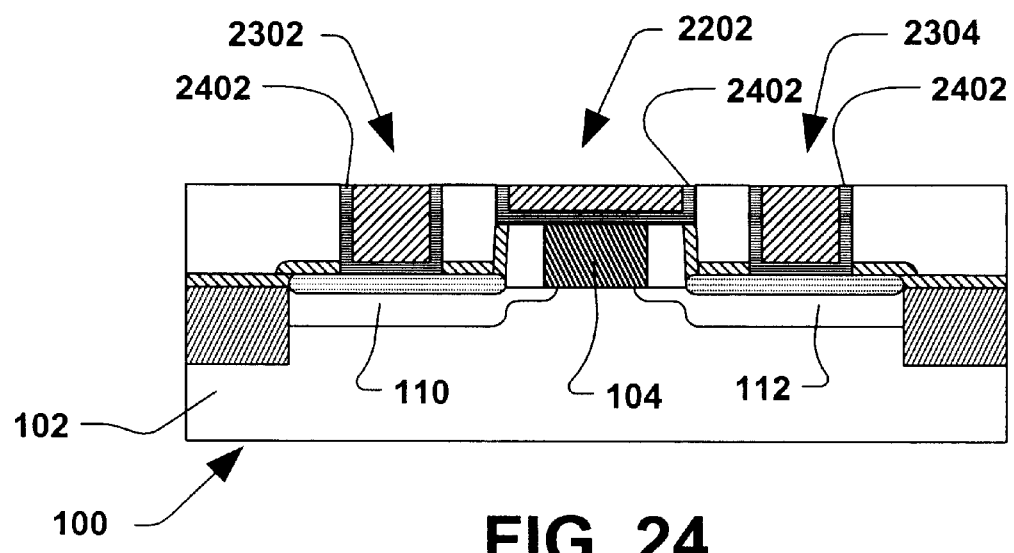

In FIG. 23, a lithography, etch and resist removal process have been performed to define contact openings 2302 and 2304. In FIG. 24, by a damascene process, the trench 2202, the contact opening 2302 and the contact opening 2304 are filled with copper or other high conductivity metal. Preferably, a barrier material 2402 such as tantalum or any of the other materials described above is first deposited in the trench 2202 and the contact openings 2302, 2304. Subsequently, the remainder of the trench 2202 and the contact openings 2302, 2304 are filled with copper or other high conductivity metal. Preferably, the damascene process is the same as the process used to form first later interconnect metallization on the integrated circuit 100.

The illustrated method has the advantage of forming damascene copper interconnects using the first metal level. The method also forms a gate structure polysilicon, barrier material and copper having low resistivity. Lastly, the method allows formation of local interconnects with the combined copper and barrier material having low resistivity.

In an alternative embodiment, following the silicon nitride deposition shown in FIG. 18, a single masking layer of low dielectric constant material is deposited on the surface of the semiconductor substrate 102. Subsequently, a chemical mechanical polishing process is conducted to planarize the top surface of the substrate 102, stopping the polishing process within the gate to polysilicon. This yields a structure looking similar to the structure illustrated in FIG. 21. At this point, the reactive ion etch process may be applied to form the trench 2202 and processing may resume as illustrated above in conjunction with FIGS. 22, 23 and 24.

From the foregoing, it can be seen that the present embodiments provide an improved method for manufacturing semiconductor devices such as field effect transistors having copper-polysilicon gate structures. Barrier layers are formed over exposed silicon source and drain regions to prevent diffusion of copper into the silicon. Damascene processes are used to be consistent with processes used for defining first level metalization in integrated circuits. A T-gate structure provides narrower polysilicon gates for minimal transistor gate length. In all cases, the copper on the gate reduces gate resistance substantially.

While a particular embodiment of the present invention has been shown and described, modifications may be made. Accordingly, it is therefore intended in the appended claims to cover such changes and modifications which follow in the true spirit and scope of the invention.

What is claimed is:

1. A method of manufacturing a field effect transistor, the method comprising:

forming a polysilicon gate on a semiconductor substrate in association with adjacent source/drain regions;

forming dielectric spacers on sides of the polysilicon gate;

forming a trench between the dielectric spacers on a surface of the polysilicon gate;

filling at least a portion of the trench with copper to form a copper-polysilicon gate of the field effect transistor;

depositing a dielectric layer over the copper-polysilicon gate, dielectric spacers and source/drain regions associated with the semiconductor substrate;

planarizing a top surface portion of the field effect transistor, wherein planarizing comprises removing a portion of the dielectric layer to a predetermined depth related to a thickness of the dielectric spacers;

selectively depositing electroless metal on the copper-polysilicon gate;

removing selected portions of the dielectric layer to expose the adjacent source/drain regions and the electroless metal on the copper-polysilicon gate; and forming a nickel silicide on the adjacent source/drain regions.

2. The method of claim 1, wherein filling the trench comprises:

depositing a barrier metal on the surface of the polysilicon gate;

depositing a copper seed layer on the barrier metal; and electroplating copper to fill at least a portion of the trench.

3. The method of claim 1, wherein planarizing comprises removing a portion of the semiconductor substrate to expose a top portion of the dielectric spacers.

4. The method of claim 1, further comprising: forming copper interconnections to the copper-polysilicon gate and the adjacent source/drain regions.

5. The method of claim 4, wherein forming copper interconnections comprises:

depositing a barrier metal on the portion of the copper-polysilicon gate and contact portions of the adjacent source/drain regions; and forming electrical contacts between the barrier metal and a copper conducting layer formed on the semiconductor substrate.

6. The method of claim 5, wherein removing selected portions of the dielectric layer comprises:

etching a gate contact in the dielectric layer, the etching stopping when the dielectric spacers are exposed by the etching; and etching source/drain contacts in the dielectric layer, the etching stopping when the adjacent source/drain regions are exposed by the etching.

7. The method of claim 1, further comprising:

selectively depositing electroless material on the copper-polysilicon gate and the adjacent source/drain regions to form electrical contacts for the field effect transistor .

8. The method of claim 1, wherein forming a nickel silicide further comprises:

depositing a layer of nickel across the semiconductor substrate;

annealing to form nickel silicide on the adjacent source/drain regions; and removing nickel from the electroless metal.

9. A semiconductor manufacturing process comprising the acts of:

forming a polysilicon gate on a semiconductor substrate;

forming dielectric spacers on opposing sides of the polysilicon gate;

etching a predetermined thickness from a surface of the polysilicon gate to define a trench between the dielectric spacers;

depositing a barrier metal on the surface of the polysilicon gate;

forming a copper gate on the barrier metal;

selectively depositing an electroless barrier metal on the copper gate;

depositing a film of nickel on the semiconductor substrate including on exposed source/drain regions formed adjacent the polysilicon gate; and forming nickel silicide on the source/drain regions.

10. The method of claim 9, wherein the barrier metal is selected from a group comprising tantalum, tantalum nitride, tungsten nitride, titanium nitride, titanium silicon nitride, and tantalum silicon nitride.

11. The method of claim 9, wherein depositing the barrier metal further comprises the acts of:

chemical vapor depositing the barrier metal on the semiconductor substrate.

12. The method of claim 9, further comprising acts of:

depositing a low-k dielectric material on the polysilicon gate and source/drain regions formed adjacent the polysilicon gate;

defining contact holes in the low-k dielectric material; and filling the contact holes with copper in a damascene process.

13. The method of claim 12, wherein the act of filling the contact holes comprises the acts of:

depositing a barrier metal in the contact holes;

forming a copper seed layer; and electroplating copper to fill the contact holes.

14. The method of claim 9, further comprising the acts of:

depositing electroless metal on the polysilicon gate and source/drain regions formed adjacent the polysilicon gate.

* * * * *

UNITED STATES PATENT AND TRADEMARK OFFICE
CERTIFICATE OF CORRECTION

PATENT NO.    : 6,440,830 B1
DATED         : August 27, 2002
INVENTOR(S)   : Sergey Lopatin It is certified that error appears in the above-identified patent and that said Letters Patent is hereby corrected as shown below:

<u>Column 1,</u>
Line 26, please replace the word "suicides" with the word -- silicides --.

Signed and Sealed this

Fifteenth Day of October, 2002

*Attest:*

JAMES E. ROGAN
*Director of the United States Patent and Trademark Office*

*Attesting Officer*